(12) United States Patent
Osawa

(10) Patent No.: US 7,703,971 B2
(45) Date of Patent: Apr. 27, 2010

(54) LED DISPLAY

(75) Inventor: Hideharu Osawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 500 days.

(21) Appl. No.: 11/635,162

(22) Filed: Dec. 7, 2006

(65) Prior Publication Data

US 2007/0127227 A1    Jun. 7, 2007

(30) Foreign Application Priority Data

Dec. 7, 2005    (JP) .............................. 2005-353087

(51) Int. Cl.
*F21V 7/04*    (2006.01)
(52) U.S. Cl. ...................................... 362/612; 362/800
(58) Field of Classification Search ................. 362/612, 362/800
See application file for complete search history.

(56) References Cited

U.S. PATENT DOCUMENTS

2006/0181863 A1*    8/2006  Fu-Yen et al. .................. 362/27
2007/0086211 A1*    4/2007  Beeson et al. ................ 362/628
2007/0171673 A1*    7/2007  Song et al. ................... 362/612
2009/0129049 A1*    5/2009  Lee et al. ..................... 362/612

FOREIGN PATENT DOCUMENTS

JP          9-97928         4/1997
JP        2008129094 A   *  6/2008

* cited by examiner

*Primary Examiner*—David V Bruce
(74) *Attorney, Agent, or Firm*—Hamre, Schumann, Mueller & Larson, P.C.

(57) ABSTRACT

An LED display includes a substrate on which an LED device including an LED element is mounted. The display also includes a light exit surface through which light emitted from the LED device exits. The light exit surface is spaced from the LED device mounting surface of the substrate in the substrate's thickness direction. The LED device is provided at a position which does not overlap the position of the light exit surface in the in-plane direction of the substrate. The LED display further includes a reflection region for reflecting light traveling from the LED device between the light exit surface and the substrate toward the light exit surface.

6 Claims, 5 Drawing Sheets

LED DISPLAY

BACKGROUND OF THE INVENTION

1. Field of the Invention

The present invention relates to an LED display and particularly to a 7-segment LED display used for displaying a numeral, for example.

2. Description of the Related Art

FIGS. 10 and 11 show a conventional LED display disclosed in JP-A-H09-97928. The illustrated LED display X includes a case 91, a lead frame 92, an LED element 93 and a transparent resin package 94. The display includes seven light exit surfaces 94a constituting seven segments, whereby a numeral selected from 0 through 9 or an alphabetical letter can be displayed. The LED element 93 is mounted on the lead frame 92 and accommodated in a recess 91a of the case 91. The transparent resin package 94 is so formed as to fill recess 91a. The case 91 is made of e.g. white resin having a relatively high light reflectivity so that inclined surfaces 91b surrounding the recess 91a serve as light reflective surfaces. When current is caused to flow through the LED element 93 in accordance with the character to be displayed, light is emitted from the LED element 93 in an upward and a lateral directions in FIG. 2. The light traveled in a lateral direction is reflected by the inclined surfaces 91b and then travels upward in the figure. These rays of light exit through the light exit surface 94a, whereby the intended character is displayed.

To cause a large amount of light emitted from the LED element 93 to travel upward in the figure, the size of the inclined surfaces 91b needs to be increased. However, when the size of the inclined surfaces 91b is increased, the height of the case 91 increases correspondingly, which hinders reduction in size and thickness of e.g. an electronic device to which the LED display X is mounted.

Further, generally, an LED display X is mounted in an electronic device to be seen from the outside. In the case where the LED display X is mounted on a circuit board, the dimension between the circuit board and the housing of the electronic device needs to be determined in view of the height of the LED display X, which limits the design options of the electronic device. Alternatively, the idea of arranging the LED display X at a location which can be seen constantly may need to be given up, and the LED display X cannot help being mounted at a location which can be seen by opening a lid of the housing, for example.

SUMMARY OF THE INVENTION

An object of the present invention, which is conceived under the circumstances described above, is to provide an LED display which is capable of being reduced in thickness and mounted at various portions.

According to the present invention, there is provided an LED display comprising a substrate, at least one light emitter mounted on a mounting-surface of the substrate and including an LED element, at least one light exit surface through which light emitted from the light emitter exits. The light exit surface is spaced from the mounting-surface of the substrate in the thickness direction of the substrate. The LED display further comprises at least one reflection region for reflecting light traveling from the light emitter between the light exit surface and the substrate toward the light exit surface. The light emitter is provided at a position which does not overlap the position of the light exit surface in the in-plane direction of the substrate.

With this structure, it is not necessary to increase the distance between the substrate and the light exit surface in order to increase the amount of light reaching the light exit surface. Therefore, it is possible to reduce the thickness of the LED display while increasing the area of the light exit surface. Moreover, the light emitted from the light emitter hardly exit directly through the light exit surface, which is advantageous for making the distribution of light exiting through the light exit surface uniform.

In a preferred embodiment of the present invention, the LED display further comprises at least one light guide portion positioned between the substrate and the light exit surface. The light guide portion includes a light incident surface facing the light emitter, and the reflection region is provided on a supported-surface of the light guide portion which is positioned adjacent to the mounting-surface of the substrate. With this structure, the light emitted from the light emitter can be properly guided to the light exit surface while keeping the distance between the substrate and the light exit surface small.

In a preferred embodiment of the present invention, the LED display includes seven light exit surfaces arranged to form a figure 8, seven light guide portions each positioned between a respective one of the seven light exit surfaces and the substrate, and seven light emitters each facing the light incident surface of a respective one of the seven light guide portions. With this structure, a segment-type LED display having a small thickness and capable of displaying an intended numeral or alphabetical letter can be realized.

In a preferred embodiment of the present invention, the LED display further comprises a light guide plate which provides the seven light guide portions and includes seven rooms each connected to the light incident surface of a respective one of the seven light guide portions and accommodating a respective one of the light emitters. With this structure, the light emitters can be arranged without increasing the thickness of the LED display. Moreover, the light emitted from the light emitters can be properly guided to the light guide portions.

In a preferred embodiment of the present invention, the light guide plate further includes a light shielding portion partitioning the seven light guide portions. With this structure, light is prevented from leaking from one light guide portion to an adjacent light guide portion. Therefore, when any light guide portion is in a light emission state, improper light emission through other light guide portions can be prevented.

In a preferred embodiment of the present invention, the light guide plate is formed with a groove or a slit for partitioning the seven light guide portions. With this structure again, light is prevented from leaking from one light guide portion to an adjacent light guide portion.

Other features and advantages of the present invention will become more apparent from detailed description given below with reference to the accompanying drawings.

DETAILED DESCRIPTION OF THE PREFERRED EMBODIMENTS

Preferred embodiments of the present invention will be described below with reference to the accompanying drawings.

Figure 1:
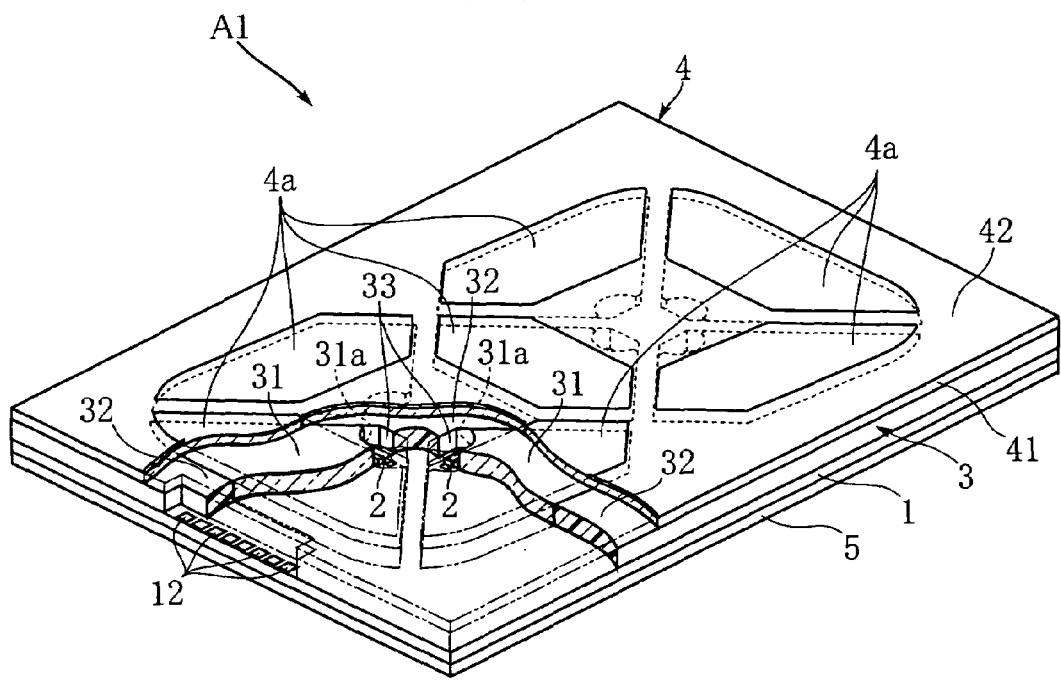
FIG. 1 is a perspective view showing, partially in section, an LED display according to a first embodiment of the present invention.
Figure 2:
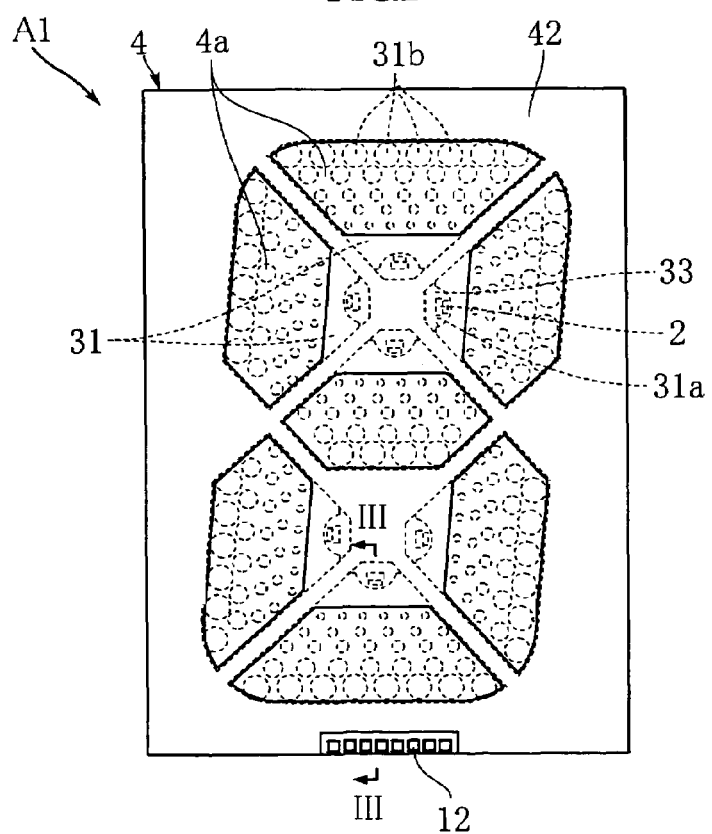
FIG. 2 is an overall plan view showing the LED display according to the first embodiment of the present invention.
Figure 3:
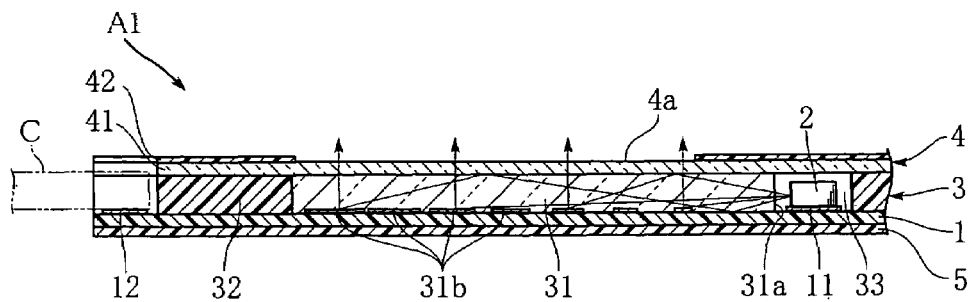
FIG. 3 is a sectional view taken along lines III-III in FIG. 2.

FIGS. 1-3 show an LED display according to a first embodiment of the present invention. The LED display A1 of this embodiment includes a substrate 1, seven LED devices 2, a light guide plate 3, a cover 4 and a light shielding sheet 5. The LED display A1 includes seven light exit surfaces 4a and is structured as a 7-segment LED display capable of displaying a numeral or alphabetical letter. The LED display A1 has a thickness of about 0.6 mm and the dimension in plan view is adaptable for about 3×5 mm to 45×63 mm.

The substrate 1 is rectangular in plan view and utilized for mounting the LED devices 2 and bonding the light guide plate 3. For instance, the substrate 1 is a printed wiring board including a resin layer and a wiring layer laminated thereon and has a thickness of about 0.1 mm. Instead of the printed wiring board, a so-called rigid board made of glass fiber reinforced epoxy resin may be used. As shown in FIG. 3, lands 11 and terminals 12 are formed on the substrate 1. The lands 11 are utilized for mounting the LED devices 2. The terminals 12 are utilized for connecting e.g. a connector C, and signals corresponding to the character to be displayed are inputted from an external controller through the terminals 12. The land 11 and the terminals 12 are electrically connected to each other.

Each of the LED devices 2 includes an LED element and is an example of light emitter according to the present invention. The LED device 2 can emit light by supplying electrical power to the LED device 2 through the connector C shown in FIG. 3. As shown in FIG. 3, the light is emitted from the LED device 2 laterally (to left in FIG. 3), i.e., in the in-plane direction of the substrate 1. This type of LED device 2 is called a side-emitting LED device. Unlike this embodiment, a lamp-type LED including a resin lens portion may be used as oriented laterally.

Figure 4:
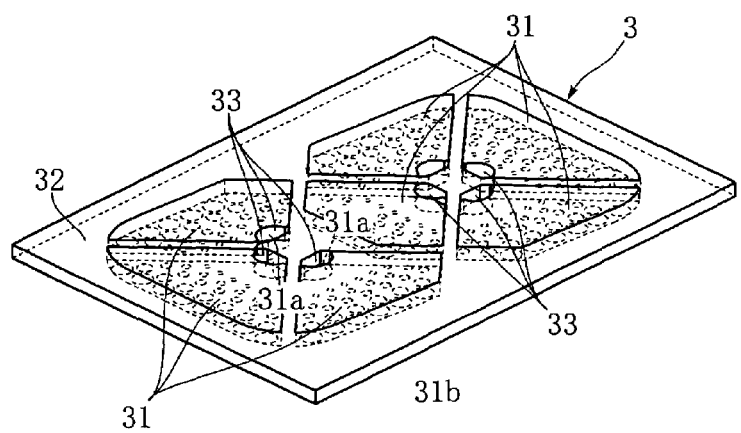
FIG. 4 is a perspective view showing a light guide plate of the LED display according to the first embodiment of the present invention.

The light guide plate 3 is bonded to the substrate 1 and serves to guide the light emitted from the LED devices 2 toward the light exit surfaces 4a. As shown in FIG. 4, the light guide plate 3 includes seven light guide portions 31 and a light shielding portion 32. In this embodiment, the light guide plate 3 has a thickness of about 0.4 mm.

Each of the light guide portions 31 is made of acrylic resin or polycarbonate resin capable of transmitting light emitted from the LED device 2 and generally in the form of a sector in plan view. The light guide portion 31 includes a recess positioned adjacent to an end thereof. The portion surrounded by the recess and the light shielding portion 32 is a room 33. The room 33 is utilized for accommodating the LED device 2 and penetrates through the light guide plate 3 in the thickness direction. The surface of the light guide portion 31 which faces the room 33 is a light incident surface 31a. The light incident surface 31a faces the LED device 2, and the light emitted from the LED device 2 impinges on the light incident surface 31a.

As shown in FIG. 3, the lower surface of each of the light guide portions 31 is formed with a plurality of light diffusion portions 31b. The light guide portions 31 may be portions of the lower surface which are made rougher than neighboring portions. As shown in FIG. 2, the light diffusion portions 31b are distributed in a region under the light exit surface 4a so that the distribution density increases as proceeding away from the LED device 2. For instance, the light diffusion portions 31b have a diameter of about 0.05 to 0.4 mm and the distribution density is about 0.1 to 0.5 mm. As shown in FIG. 3, the light emitted from the LED device 2 is reflected by the light diffusion portions 31b to travel upward. Each of the light diffusion portions 31b is an example of reflection region according to the present invention.

The light shielding portion 32 serves to prevent the light traveling within the light guide portions 31 from unduly leaking to the outside of the light guide portions 31. The light shielding portion 32 surrounds each of the seven light guide portions 31. For instance, the light shielding portion 32 is made of white polycarbonate resin or ABS resin. To enhance the reflectivity for the light emitted from the LED devices 2, it is preferable that the light shielding portion 32 contains titanium.

The cover 4 covers the light guide plate 3. The seven light exit surfaces 4a as the characteristic of the 7-segment LED display are provided by the cover 4. Specifically, the cover 4 includes a light transmitting layer 41 and a light shielding layer 42. For instance, the light transmitting layer 41 is made of polyethylene terephthalate resin or polycarbonate resin and has a thickness of about 0.1 mm. The light shielding layer 42 covers the light transmitting layer 41 while exposing portions of the light transmitting layer 4 to provide the light exit surfaces 4a. For instance, the light shielding layer 42 may be formed by performing printing on the obverse surface of the light transmitting layer 41 using black paint. The cover may be so designed as to diffuse the light from the light guide portion 31 to realize uniform light distribution. For this purpose, the light transmitting layer 41 may be made of milk-white resin, or a light-transmitting milk-white paint may be applied to the surface.

The seven light exit surfaces 4a comprise the portions of the light transmitting layer 41 which are not covered by the light shielding layer 42. As shown in FIG. 2, the light exit surfaces 4a are so arranged as to form a figure 8. As shown in this figure, the size in plan view of each of the light exit surfaces 4a is smaller than that of the light guide portion 31. In the light guide portion 31, the light incident surface 31a is provided at a position which is farthest from the light exit surface 4a in plan view. Thus, the LED device 2 is disposed at a position retreated inward from the light exit surface 4a in the in-plane direction of the substrate 1.

As shown in FIGS. 1 and 3, the light shielding sheet 5 is bonded to the lower surface of the substrate 1. The light shielding sheet 5 is provided to make the light shielding perfect on the lower surface side of the substrate 1.

The operation and advantages of the LED display A1 will be described below.

Figure 11:
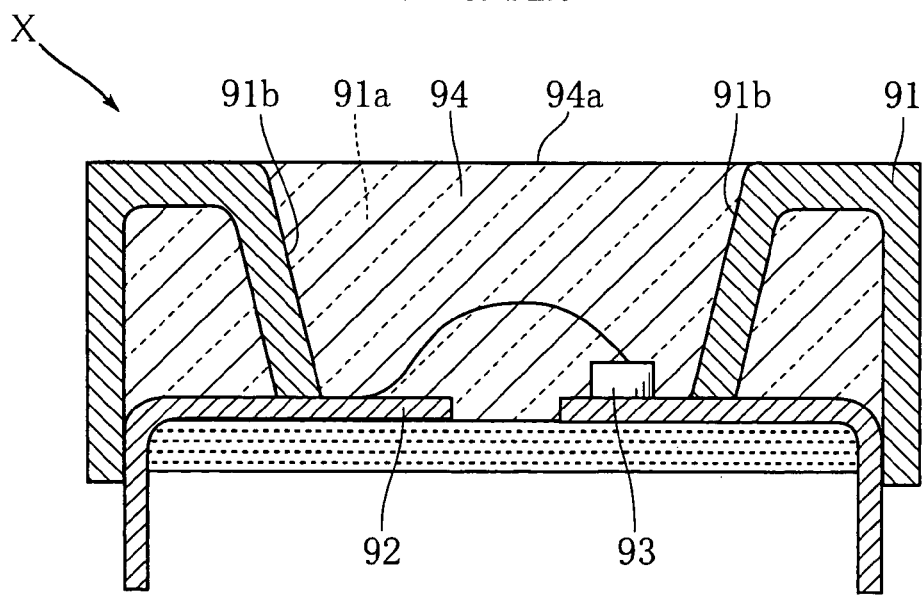
FIG. 11 is a sectional view taken along lines XI-XI in FIG. 10.

According to this embodiment, the light emitted from the LED device 2 enters the light guide portion 31 through the light incident surface 31*a*. The light is then guided toward the light exit surface 4*a* by the light diffusion portions 31*b* provided on the bottom surface side of the light guide portion 31. The dimension of the light diffusion portions 31*b* in the thickness direction of the light guide plate 3 is extremely small. Therefore, unlike the structure shown in FIG. 11 which includes inclined surfaces 91*b*, the thickness of the light guide plate 3 does not need to be increased even when the area of the light exit surface 4*a* is increased. Therefore, the thickness of the LED display A1 can be reduced, which is suitable for reducing the size and thickness of an electronic device in which the LED display A1 is mounted.

The light emitted from the LED device 2 reaches the light exit surface 4*a* after it is reflected by the light diffusion portions 31*b*. Therefore, almost all of the light rays exiting through the light exit surface 4*a* are indirect light rays and do not include light rays traveling directly from the LED device 2. Therefore, noticeable nonuniformity in light distribution can be prevented, which prevents such a situation that a certain portion of the light exit surface 4*a* is extremely bright as compared with other portions. Particularly, the arrangement of the light diffusion portions 31*b* in which the distribution density increases as proceeding away from the LED device 2 is advantageous for realizing the uniform light distribution at the light exit surface 4*a*. When the light transmitting layer 41 is milk-white, the uniformity of the light distribution at the light exit surface 4*a* can be further enhanced. Moreover, since the light incident surface 31*a* is dented, the light traveling from the LED device 2 can be spread in the in-plane direction of the light guide portion 31, which is also advantageous for the uniform light distribution at the light exit surface 4*a*.

The provision of the light shielding portion 32 prevents light from leaking from one light guide portion 31 to an adjacent light guide portion 31. Therefore, when any selected light exit surface 4*a* is in a light emission state, light emission from other light exit surfaces 4*a* which are not selected can be prevented.

As shown in FIG. 3, the LED display A1 can be mounted to an electronic device by using a connector C. Therefore, the LED display A1 does not need to be bonded to e.g. a circuit board accommodated in the housing of the electronic device. Instead, the LED display A1 can be bonded to a surface of the housing. Further, it is also possible to bond the LED display A1 to a surface of a panel which is already installed so that the panel can additionally display numerical information which can be changed as desired.

FIGS. 5-9 show other embodiments of the present invention. In these figures, the elements which are identical or similar to those of the foregoing embodiment are designated by the same reference signs as those used for the foregoing embodiment.

Figure 5:
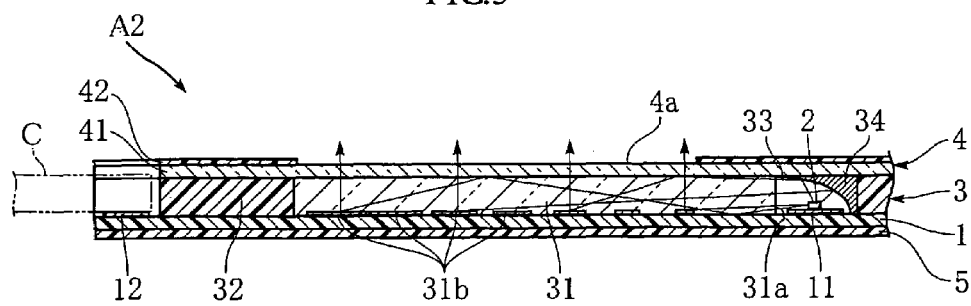
FIG. 5 is a sectional view showing a principal portion of an LED device according to a second embodiment of the present invention.

FIG. 5 shows an LED display according to a second embodiment of the present invention. The LED display A2 of this embodiment differs from that of the foregoing embodiment in that the LED display A2 utilizes an LED element 21 as the light emitter. The LED element 21 is a light emitting element of a so-called bare chip type and emits light in an upward and a lateral directions in the figure. A reflector 34 is provided in an upper left portion of the room 33 in the figure. The reflector 34 may be made of aluminum, for example, and serves to reflect light emitted from the LED element 21 and traveling upward or rightward in the figure toward the light incident surface 31*a* positioned on the left in the figure. In this embodiment again, the thickness of the LED display A2 can be reduced.

Figure 6:
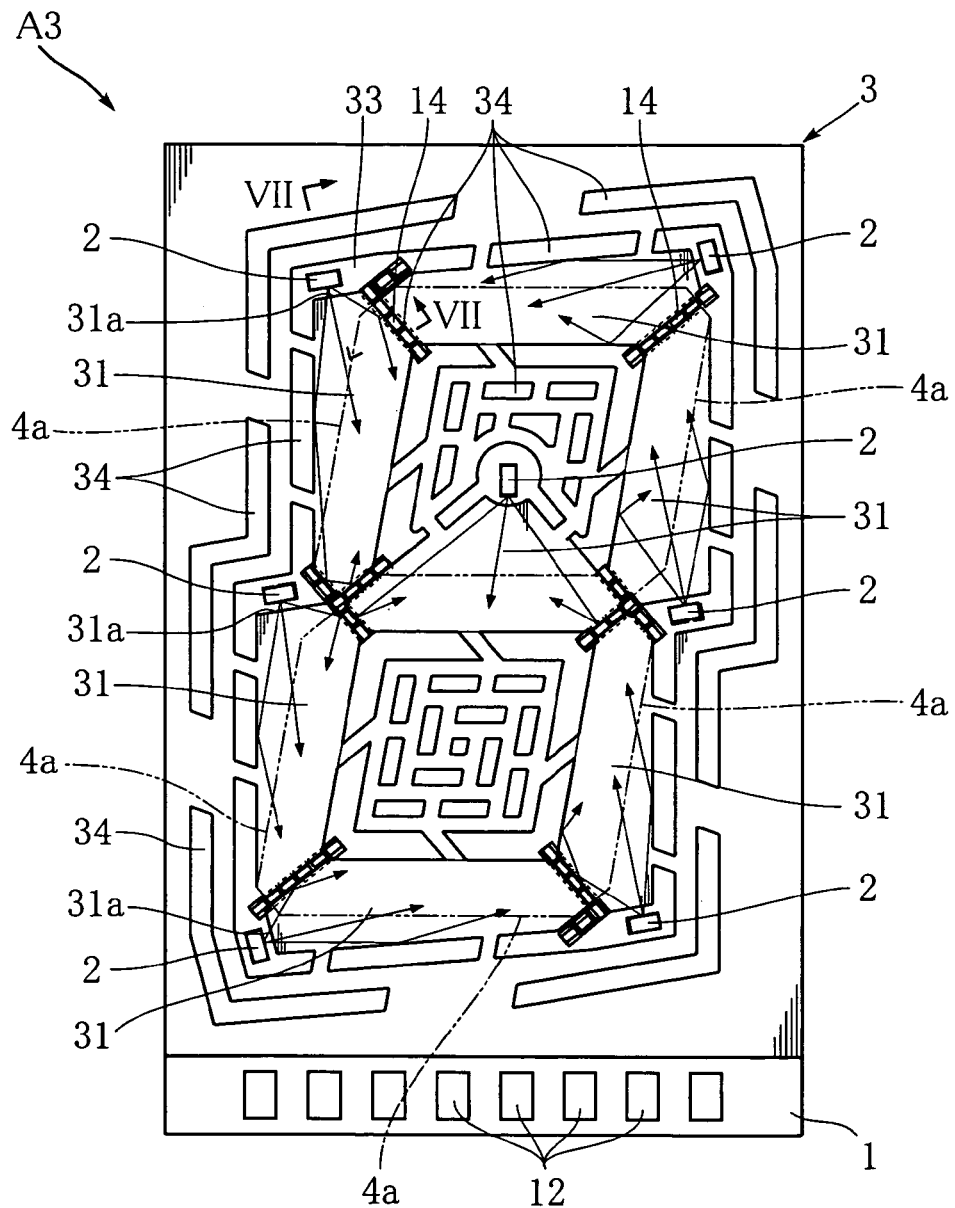
FIG. 6 is a plan view showing a principal portion of an LED device according to a third embodiment of the present invention.
Figure 7:
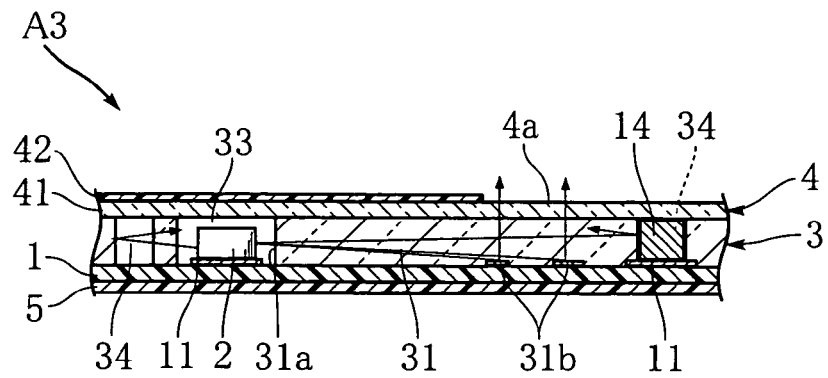
FIG. 7 is a sectional view taken along lines VII-VII in FIG. 6.

FIGS. 6 and 7 show an LED display according to a third embodiment of the present invention. The LED display A3 of this embodiment differs from the foregoing embodiments in structure of the light guide plate 3. For easier understanding, the illustration of the cover 4 is omitted in FIG. 6.

The light guide plate 3 of the LED display A3 is formed with a plurality of slits 34. The slits 34 penetrate the light guide plate 3 in the thickness direction and serve to block light emitted from the LED devices 2 by utilizing difference in refractive index between air and the material of the light guide plate 3 such as acrylic resin. The slits 34 include those which surround the seven light guide portions 31 from outside, those which partition the adjacent light guide portions 31 and those positioned inward of the light guide portions 31. The slits 34 surrounding the light guide portions 31 from outside serve to prevent light from leaking to the outside of the LED display A3. The slits 34 partitioning the adjacent light guide portions 31 serve to prevent light from leaking from a light guide portion 31 in the light emission state to a light guide portion 31 in a non-light-emission state. Light shielding walls 14 are fitted in the slits 34 partitioning the adjacent light guide portions 31. As shown in FIG. 7, each of the light shielding walls 14 comprises a metal piece disposed on a pad 11 of the substrate 1, for example. As the material of the light shielding wall 14, any material can be used as long as it can block light, and resin may be used, for example. The slits 34 positioned inward of the light guide portions 31 serve to block light between mutually facing light guide portions 31. In this embodiment, though not shown in FIG. 6, a plurality of light diffusion portions are provided in each of the light guide portions 31 at a region corresponding to the light exit surface 4*a*, similarly to the first embodiment.

The light guide plate 3 according to this embodiment can be easily formed by molding such as injection molding or transfer molding, which is advantageous for enhancing the manufacturing efficiency and reducing the manufacturing cost of the LED display and also for reducing the size of the LED display. As means for blocking light between adjacent light guide portions 31, a groove which does not penetrate through the light guide plate 3 may be formed instead of the slit 34 which penetrates through the light guide plate 3. In this case, it is preferable to make the depth of the groove as large as possible to reliably prevent the light leakage.

Figure 8:
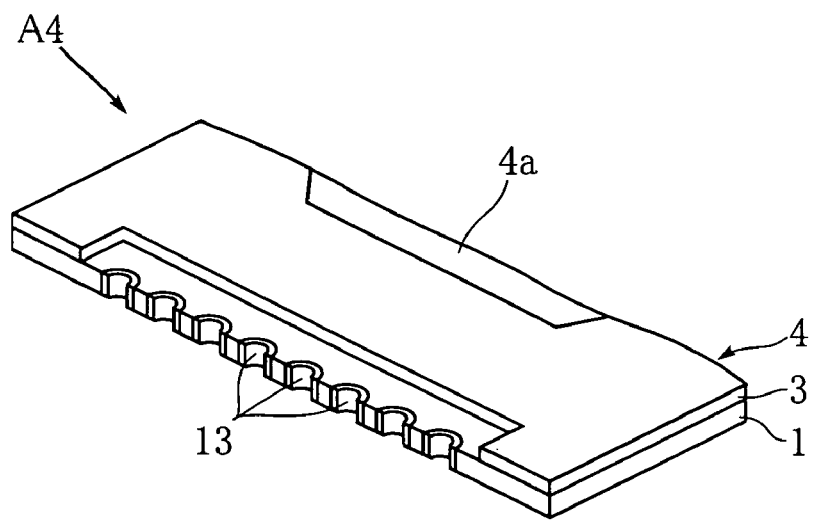
FIG. 8 is a perspective view showing a principal portion of an LED device according to a fourth embodiment of the present invention.

FIG. 8 shows an LED display according to a fourth embodiment of the present invention. The LED display A4 of this embodiment differs from the foregoing embodiment in that the LED display A4 includes through-hole terminals 13. By the provision of the through-hole terminals 13, the LED display A3 can be surface-mounted to a printed circuit board, for example. In this way, the LED display according to the present invention is adaptable to various modes of mounding such as connector connection, surface-mount connection and pin connection.

Figure 9:
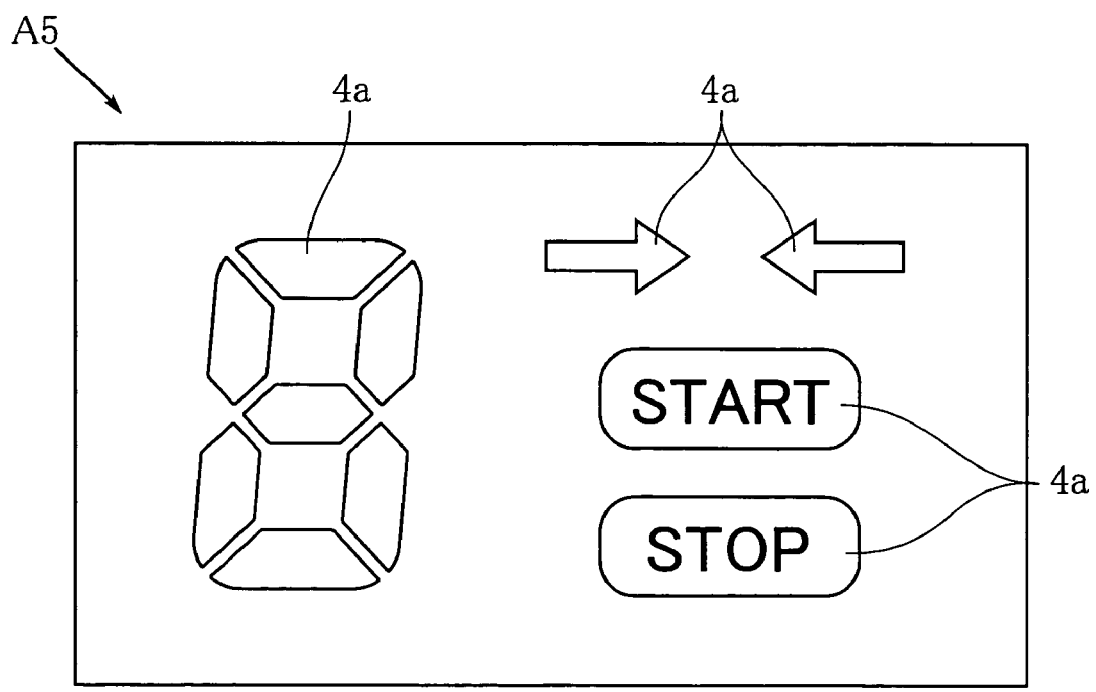
FIG. 9 is an overall plan view showing an LED device according to a fifth embodiment of the present invention.
Figure 10:
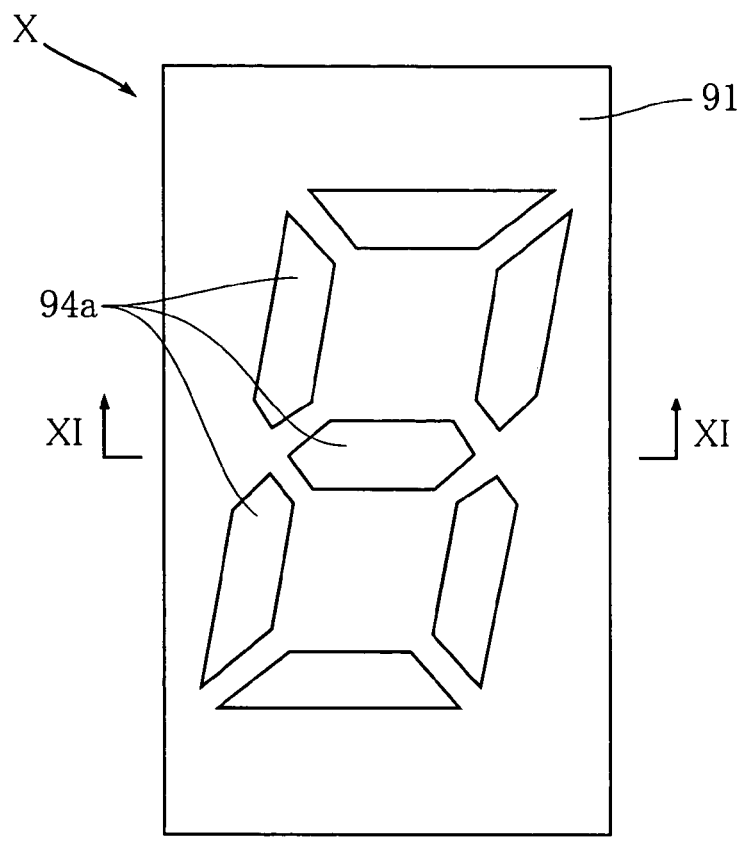
FIG. 10 is an overall plan view showing an example of conventional LED display.

FIG. 9 shows an LED display according to a fifth embodiment of the present invention. In addition to the seven light exit surfaces 4*a* as the characteristic of the 7-segment LED display, the LED display A5 includes a pair of display surfaces 4*a* in the form of an arrow and two light exit surfaces 4*a* including letter regions made of a light shielding material. As will be understood from this embodiment, the LED display according to this embodiment is not limited to 7-segment LED display, and the shape of the light exit surfaces 4*a* can be changed in various ways to display the intended contents.

The LED display according to the present invention is not limited to the foregoing embodiments. The specific structure of each part of the LED display according to the present invention can be changed in various ways.

The invention claimed is:

1. An LED display comprising:

a substrate;

a plurality of separate light emitters each mounted on a mounting-surface of the substrate and including an LED element;

a plurality of separate light exit regions corresponding to the light emitters, respectively, so that light emitted from each of the light emitters exits through a corresponding one of the light exit regions, the light exit regions being spaced from the mounting-surface of the substrate in a thickness direction of the substrate; and a plurality of reflection regions corresponding to the light emitters, respectively, for reflecting light traveling from the light emitters between the light exit regions and the substrate toward the light exit regions;

wherein each of the light emitters is provided at a position which does not overlap a position of the corresponding one of the light exit regions in an in-plane direction of the substrate.

2. The LED display according to claim 1, further comprising a plurality of light guide portions each positioned between the substrate and a corresponding one of the light exit regions, wherein each of the light guide portions includes a light incident surface facing a corresponding one of the light emitters, and wherein each of the reflection regions is provided on a supported-surface of a corresponding one of the light guide portions, the supported-surface being positioned adjacent to the mounting-surface of the substrate.

3. The LED display according to claim 2, wherein the plurality of light exit regions are arranged to form a figure 8.

4. The LED display according to claim 3, further comprising a light guide plate which provides the light guide portions and includes a plurality of rooms each connected to the light incident surface of a respective one of the light guide portions, wherein the light emitters are accommodated in the rooms, respectively.

5. The LED display according to claim 4, wherein the light guide plate further includes a light shielding portion partitioning the light guide portions.

6. The LED display according to claim 4, wherein the light guide plate is formed with a groove or a slit for partitioning the light guide portions.

* * * * *